US011333967B2

(12) United States Patent
Chiu et al.

(10) Patent No.: US 11,333,967 B2
(45) Date of Patent: May 17, 2022

(54) RETICLE CONTAINER

(71) Applicant: Gudeng Precision Industrial CO., LTD., New Taipei (TW)

(72) Inventors: Ming-Chien Chiu, New Taipei (TW); Yung-Chin Pan, New Taipei (TW); Chih-Sheng Hung, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 110 days.

(21) Appl. No.: 16/706,612

(22) Filed: Dec. 6, 2019

(65) Prior Publication Data

US 2020/0183267 A1  Jun. 11, 2020

(30) Foreign Application Priority Data

Dec. 6, 2018  (TW) .................................. 107143848
Feb. 25, 2019  (TW) .................................. 108106377
Nov. 18, 2019  (TW) .................................. 108141709

(51) Int. Cl.
*G03F 1/66* (2012.01)
*H01L 21/673* (2006.01)

(52) U.S. Cl.
CPC .......... *G03F 1/66* (2013.01); *H01L 21/67359* (2013.01)

(58) Field of Classification Search
CPC ...... G03F 1/66; G03F 7/2063; G03F 7/70741; H01L 21/67359; H01L 21/67353; H01L 21/67294; H01L 21/67389
USPC ................................ 220/4.01, 4.08; 206/454
See application file for complete search history.

(56) References Cited

U.S. PATENT DOCUMENTS

| | | | | |
|---|---|---|---|---|
| 1,120,955 A | * | 12/1914 | Martin ................. | B65D 5/0005 229/101 |
| 1,344,408 A | * | 6/1920 | King ....................... | A45C 7/00 190/15 R |
| 2,907,487 A | * | 10/1959 | Harrington ............ | A47B 88/90 220/8 |
| 4,079,835 A | * | 3/1978 | Kendig .............. | B65D 21/0234 206/303 |
| 4,585,122 A | * | 4/1986 | Stegenga ............. | H05K 7/1427 220/260 |
| 5,105,335 A | * | 4/1992 | Honda .............. | H01L 21/67353 16/445 |
| 5,251,749 A | * | 10/1993 | Knight ................... | A47B 47/04 206/307.1 |
| 5,582,313 A | * | 12/1996 | Envall ..................... | B60R 9/055 220/4.28 |

(Continued)

FOREIGN PATENT DOCUMENTS

KR  10-2014-0007555 A  1/2014

*Primary Examiner* — J. Gregory Pickett
*Assistant Examiner* — Jenine Pagan
(74) *Attorney, Agent, or Firm* — Cheng-Ju Chiang (57) ABSTRACT

The present invention discloses a reticle container which comprises an upper cover and a lower cover. A plurality of identification modules is disposed on the edge of the reticle container. Therefore, the user can quickly identify the usage of the reticle container or number per se. On the other hand, the reticle container of the present invention further comprises supporters, sustainers and connecting modules. Therefore, the reticle container of the present invention is able to satisfy various structural requirements and conditions for carrying the reticle in a sealed environment.

10 Claims, 12 Drawing Sheets

(56) References Cited

U.S. PATENT DOCUMENTS

| | | | | |
|---|---|---|---|---|
| 6,030,060 | A * | 2/2000 | Drake | H05K 7/1425 |
| | | | | 206/708 |
| 6,386,381 | B2 * | 5/2002 | Csiszar | B65D 21/083 |
| | | | | 220/4.03 |
| 8,844,739 | B2 * | 9/2014 | Holey | B65D 81/263 |
| | | | | 220/4.01 |
| 9,884,702 | B1 * | 2/2018 | Burns | A63C 11/026 |
| 2005/0279666 | A1 | 12/2005 | Deng et al. | |
| 2007/0205135 | A1 * | 9/2007 | Goldman | A45C 3/02 |
| | | | | 206/776 |
| 2011/0233096 | A1 * | 9/2011 | Michels | B65D 25/205 |
| | | | | 206/459.5 |

\* cited by examiner

RETICLE CONTAINER

CROSS-REFERENCE TO RELATED APPLICATION AND CLAIM OF PRIORITY

This application claims the benefit of Taiwanese Patent Application No. 107143848, 108106377 and 108141709, filed on Dec. 6, 2018, Feb. 25, 2019 and Nov. 18, 2019 in the Taiwan Intellectual Property Office respectively. The disclosure of the aforementioned applications is incorporated herein in its entirety by reference.

TECHNICAL FIELD

At least one embodiment of the present invention relates to a reticle container. More particularly, the reticle container comprises several adjustable parts thus to increase the portability, convenience and safety of carrying said reticle container per se.

DESCRIPTION OF THE RELATED ART

In the semiconductor industry, reticle plays a very important role in the process. No matter the traditional lithography, etching, or even the advanced extreme ultraviolet lithography (EUVL) technology cannot avoid using the reticle.

Among the direct or indirect related industries of semiconductor industries, optoelectronic related industry is one of the most important industries. The size of the reticle used in the process of large-sized panel also changes the size per se to suitable for such panel. Under the premise of technology development, the panel size that can be produced by the existing panel industry has gradually increased, and the size of the reticle required for the process has increased, too.

Corresponding to the semiconductor industry of manufacturing processors or chips, the reticle used in the panel industry can be sized 800 mm×960 mm, thus said reticle cannot be transferred or stored in a conventional reticle pod but a large-sized reticle case.

However, the large-sized reticle case usually presents an obvious inertial motion. In fact, a large-sized reticle case is more easily to be shaken, bumped, or caused to collapse during handling or transport. Furthermore, the abovementioned reasons cause damage to the large-sized reticle.

The required transmission and storage conditions of the various panel or semiconductor industries are not necessarily the same. For example, in some factories, the transportation process is prone to swinging left and right; in some industries, there is a vertical movement, which causes the large-sized reticle having a displacement and scratching phenomenon. Therefore, the reticle cases for various purposes are not all the same according to various needs. In current technology, the reticle cases are still difficult to overcome the abovementioned problems.

SUMMARY

The present invention discloses a reticle container which comprises a plurality of assembling unit, an upper cover and a lower cover.

The abovementioned upper cover comprises a first left case and a first right case. The first left case connects to one of the plurality of assembling unit by a first left connecting zone, and the first right case connects to one of the plurality of assembling unit which is the same as the first left case by a first right connecting zone.

The abovementioned lower cover comprises a second left case and a second right case. The second left case connects to another one of the plurality of assembling unit by a second left connecting zone, and the second right case connects to one of the plurality of assembling unit which is the same as the second left case by a second right connecting zone.

In the present invention, the upper cover matches with the lower cover, forming an edge. Furthermore, at least one identification module is configured on the edge. On the other hand, four corners of an inner space of the upper cover or the lower cover are constructed as a sustaining area and the boundary of the inner space of the lower cover is constructed as a supporting area.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

DESCRIPTION OF THE PREFERRED EMBODIMENTS

The drawings disclose some preferred embodiments of the present invention, which are intended to be used with the descriptions herein to enable one skilled in the art to understand the claimed features, as well as to make and use the claimed invention.

Figure 1:
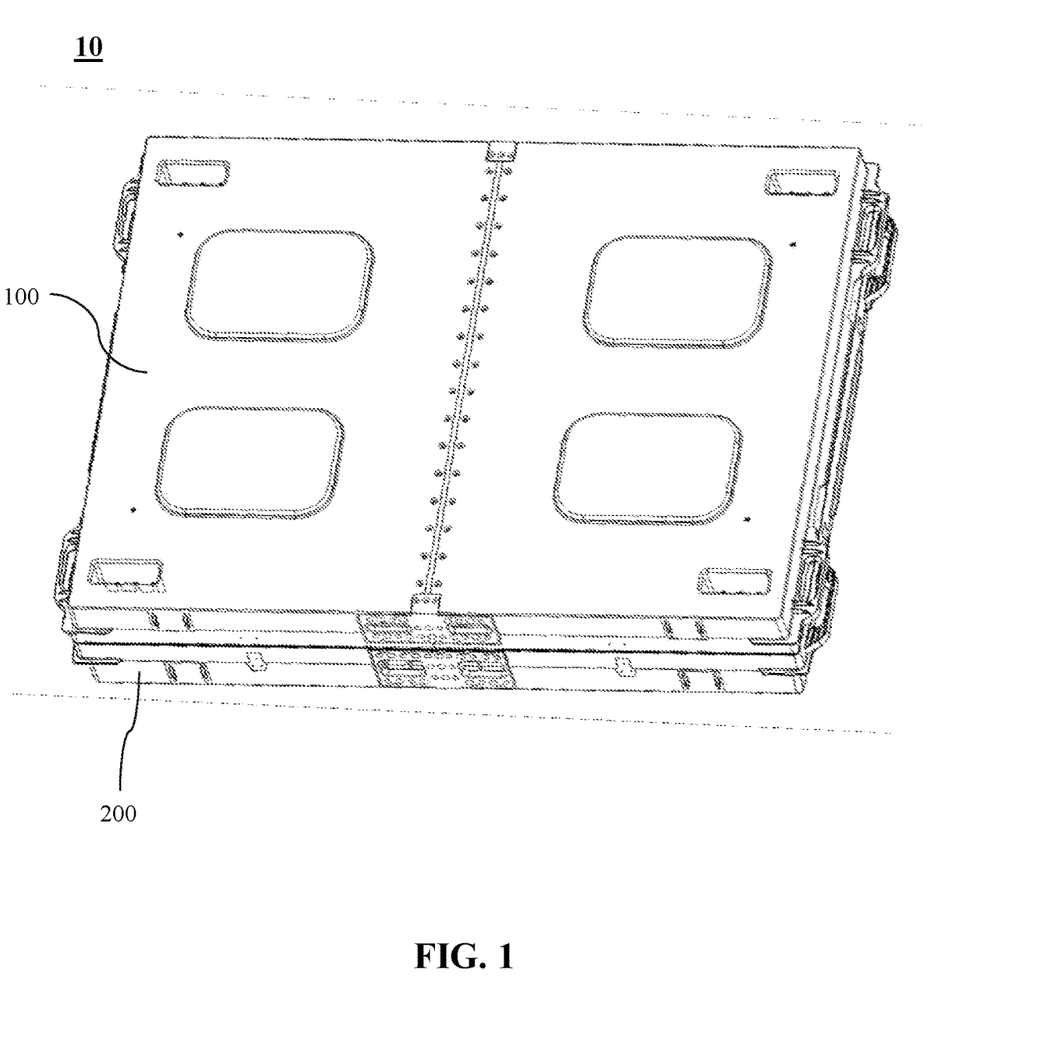
FIG. 1 is an external structure diagram of the reticle container according to the embodiment of the present invention.
Figure 2:
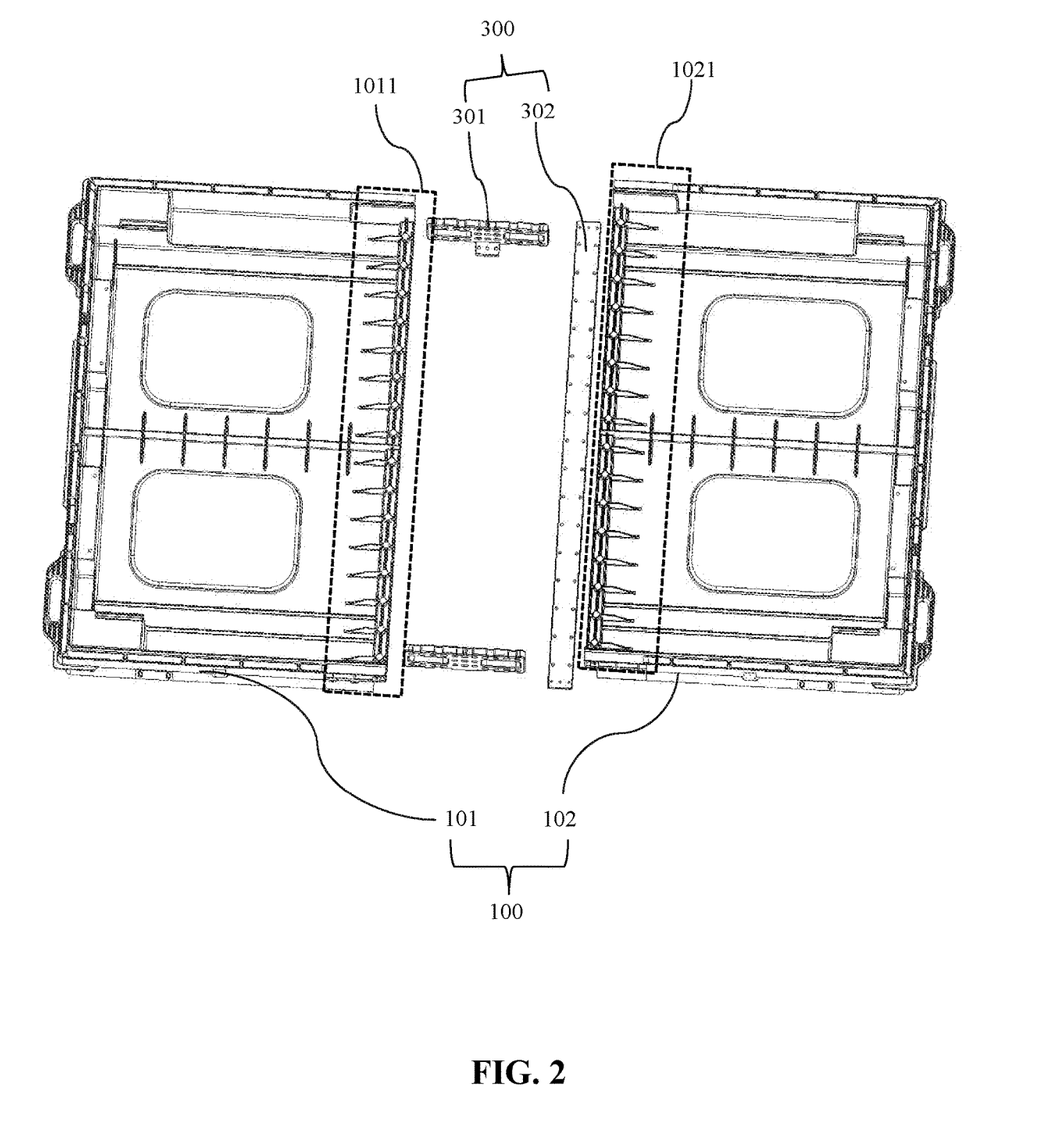
FIG. 2 is a structure diagram of the upper cover according to the embodiment of the present invention.
Figure 3:
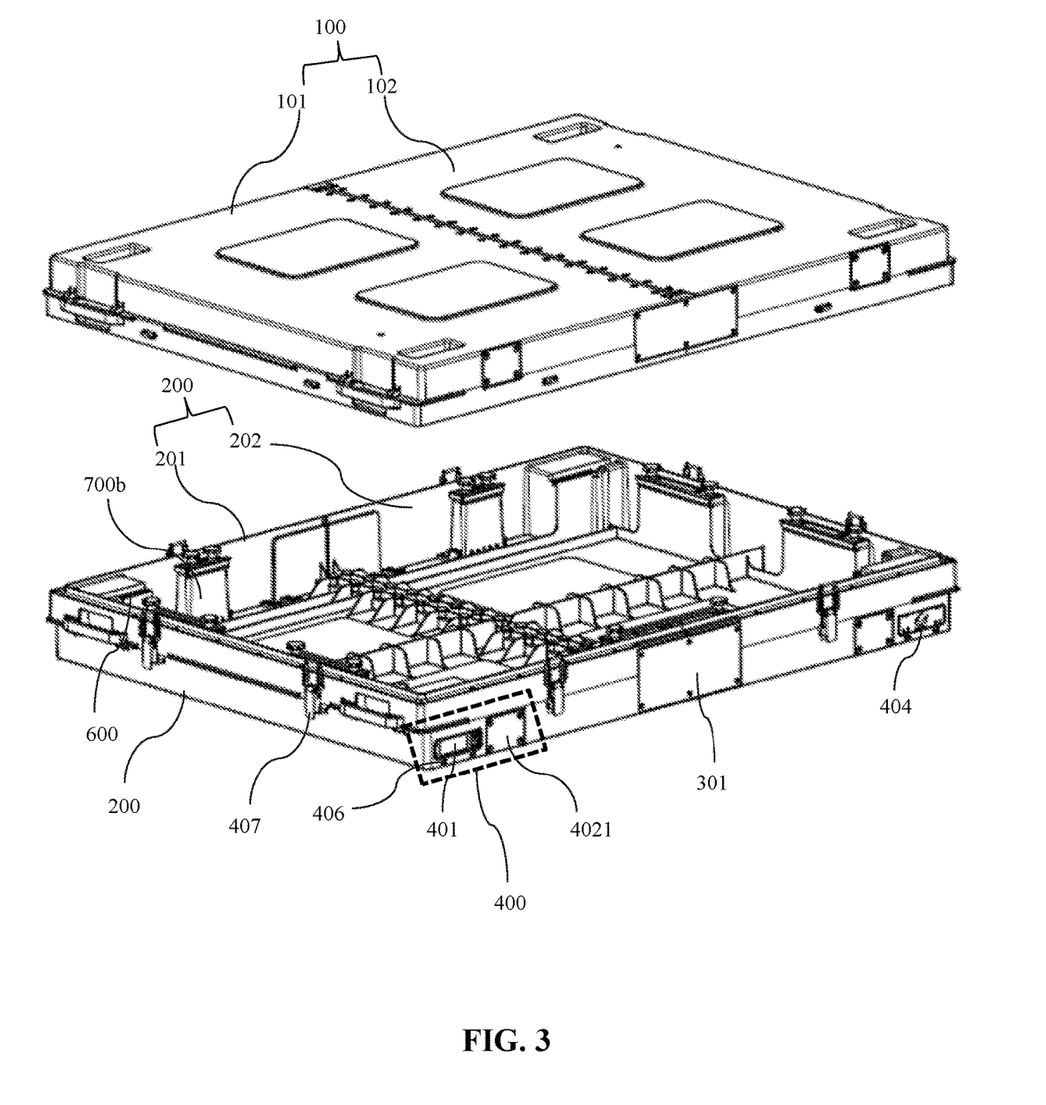
FIG. 3 is an internal structure diagram of the reticle container according to the embodiment of the present invention.

Regarding to FIG. 1 to FIG. 3. FIG. 1 is an external structure diagram of the reticle container according to the embodiment of the present invention. FIG. 2 is a structure diagram of the upper cover according to the embodiment of the present invention. FIG. 3 is an internal structure diagram of the reticle container according to the embodiment of the present invention.

FIG. 1 illustrates the embodiment of the present invention, the reticle container 10. As shown in FIG. 1, the reticle container 10 mainly constructed by an upper cover 100 and a lower cover 200. The upper cover 100 matches with the lower cover 200. Thus make the reticle container 10 has an edge. Please refer to FIG. 2, the upper cover 100 is mainly described in FIG. 2, however the lower cover 200 should be regarded as to have similar structure of the upper cover 100. As the embodiment illustrated in FIG. 2, upper cover 100 and lower cover 200 are connected by a plurality of assembling unit 300. In the present embodiment, the number of the assembling, unit 300 is two. One of the plurality of assembling unit 300 is configured in the upper cover 100, the other is configured in the lower cover 200. Moreover, single assembling unit 300 comprises a main frame 302 which connects to two plates 301 in the head and end per se. In fact, the single assembling unit 300 can be integrally formed in the other embodiment. The present invention is not limited thereto.

In present embodiment, the plates 301 are configured on the edge of the reticle container 10. According to the information provided in FIG. 2, the upper cover 100 is obviously formed by a connection between first left case 101 and first right case 102. Particularly, the first left case 101 connects to one of the plurality of assembling unit 300 by a first left connecting zone 1011, and the first right case 102 connects to the same assembling unit 300 of the first left case 101 by a first right connecting zone 1021.

On the other hand, the lower cover 200 of the present embodiment also formed via the connection between the second left case 201 and the second right case 202. Thought the FIG. 2 fail to show, please refer to the structure of the first left connecting zone 1011 shown in FIG. 2. The second left case 201 connects to another one assembling unit 300 by a second left connecting zone (Not shown in FIG. 2), and the second right case 202 connects to abovementioned assembling unit 300 which is the same as the second left case 201 by a second right connecting zone (Not shown in FIG. 2).

Figure 5:
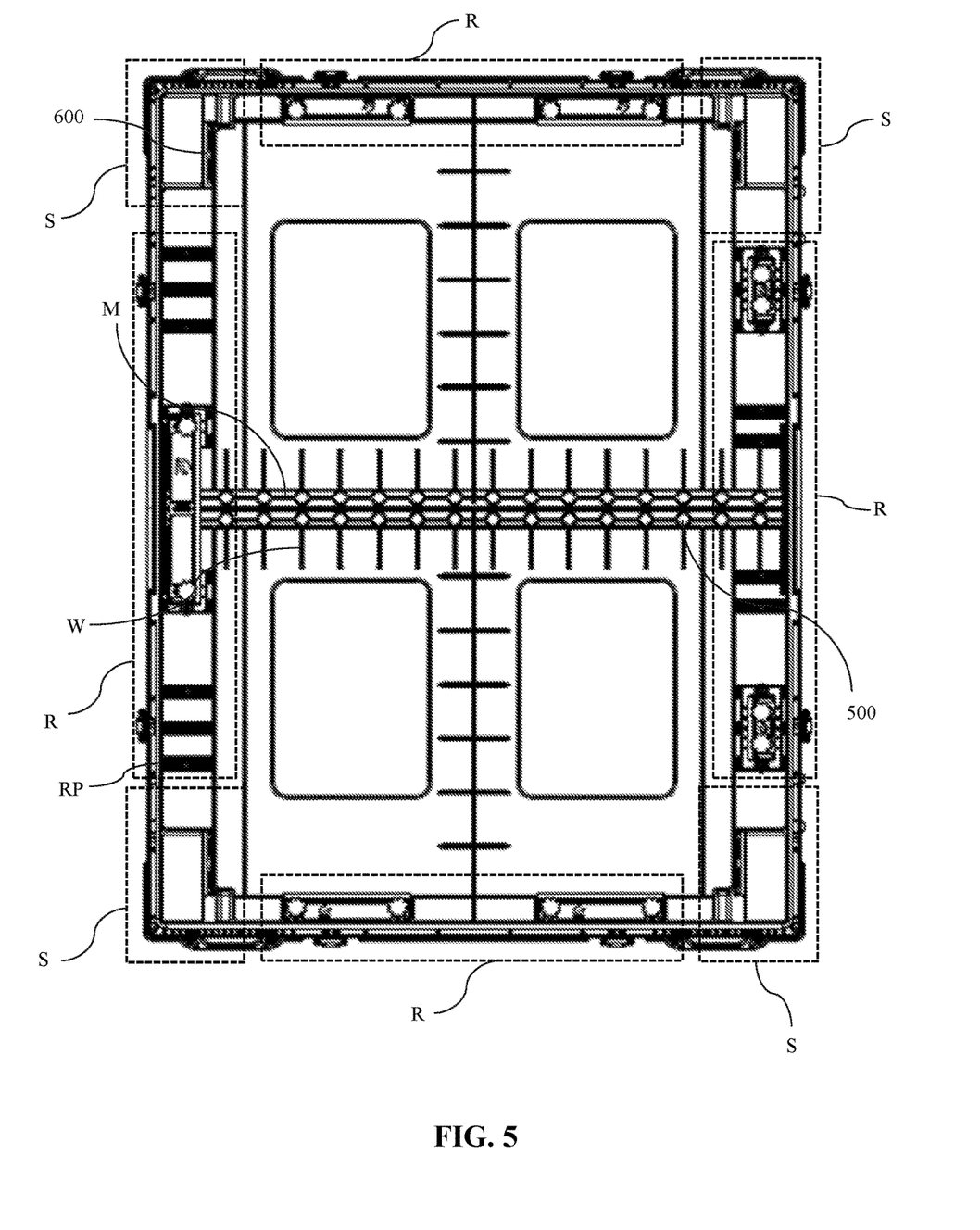
FIG. 5 is a location diagram of the sustaining area and the supporting area according to the embodiment of the present invention.

Therefore, when the upper cover 100 and the lower cover 200 of the present embodiment have been prepared well, please refer to FIG. 3. FIG. 3 illustrated that the edge of the reticle container 10 further comprises at least one identification module 400. On the other hand, please refer to FIG. 5. FIG. 5 is a location diagram of the sustaining area and the supporting area according to the embodiment of the present invention. As shown in FIG. 5, the embodiment in FIG. 5 is the lower cover 200. However, the upper cover 100 or the lower cover 200 of the present invention can be designed or planned to have the same or related functional area such as the sustaining area S and supporting area R recited in FIG. 5. The present invention is not limited thereto. The embodiment of FIG. 5 illustrates the inner space of the lower cover 200 of the reticle container 10. In other words, four corners of the lower cover 200 configured in said inner space are constructed as sustaining area S and boundary of said inner space is constructed as supporting area R.

In the present embodiment, the function of the lower cover 200 is to prevent the sliding of reticle and support the weight of said reticle, when the reticle container 10 is lying down. Specifically, the reticle used in the present embodiment is the large-sized reticle which is usually used in panel industry and can be sized thereto 800 mm×960 mm. The aforementioned large-sized reticle is more heavier than the other kinds of reticle, thus the inertial motion of said large-sized reticle is greater while transporting or retaining, resulting in shaking, colliding, rupturing, or even the collapse of said reticle container 10. That is the reason why the present embodiment solves the large-sized reticle displacement related problems via four corners of the lower cover 200 configured in said inner space are constructed as sustaining area S and boundary of said inner space is constructed as supporting area. R, and so do the upper cover 100.

Figure 4:
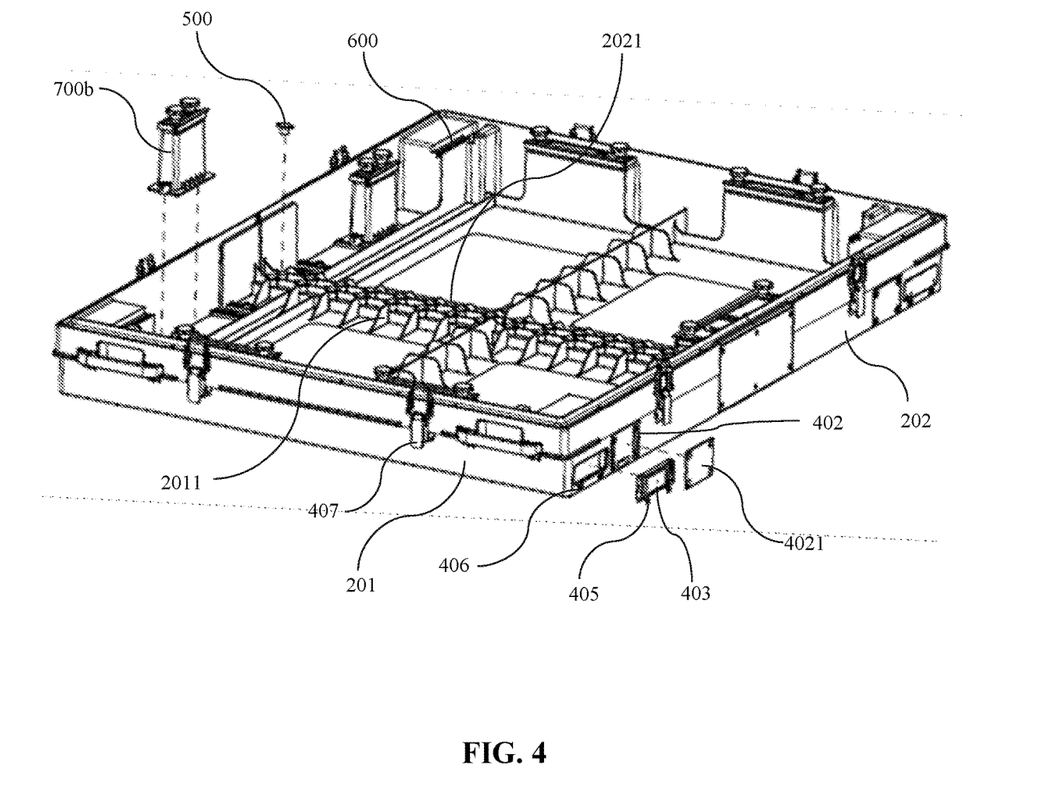
FIG. 4 is an assembly drawing of the lower cover according to the embodiment of the present invention.

Please refer to FIG. 3 to FIG. 5 simultaneously. FIG. 4 is an assembly drawing of the lower cover according to the embodiment of the present invention. First of all, as shown in FIG. 3, at least one identification module 400 is configured on the edge of said reticle container 10. Moreover, the first left case 101, the first right case 102, the second left case 201 and the second right case 202, even the assembly thereof such as the upper cover 100, the lower cover 200 and the environmental data which comprises the humidity and cleanliness in the reticle container 10 should be individually and simultaneously monitored. Therefore, the present embodiment shows that the at least one identification module 400 can be configured on each single first left case 101, first right case 102, second left case 201 and second right case 202.

The abovementioned identification module 400 comprises a slot 401, an identification unit 402, a monitoring device 403 and a cover 404. The slot 401 has an opening which is able to contain the monitoring device 403. On the other hand, identification unit 402 is configured on said edge of reticle container 10 reaches to the configuration place of slot 401. As shown in FIG. 3, in the present embodiment, identification unit 402 is an RFID Tag, therefore the protection lid 4021 protects and embed said identification unit 402 in the lowercover 200. Furthermore, the monitoring device 403 comprises a small screen (or panel) which is used to provide the data such as the humidity or cleanliness of reticle container 10. Of course, the aforementioned data such as humidity and cleanliness is provided from the sensors or detectors which are set in or out of the reticle container 10. The connection between the sensors, detectors and the monitoring device 403 are able to be wirelessly connected, thus to show such data on the small screen (or panel) of the monitoring device 403 to notice those who operates the reticle container 10.

In fact, the monitoring device 403 further comprises at least one engaging unit 405 which can detachably connect to at least one engaging slot 406 configured in slot 401, and as shown in FIG. 4, the cover 404 matches with the opening of said slot 401, thus to protect monitoring device 403.

The abovementioned protection lid 4021 and cover 404 are designed as a structure having a piece with buckles in the present embodiment, and the present invention is not limited thereto. Furthermore, in order to prevent the heavy large-sized reticle causes the risk that the upper cover 100 and the lower cover 200 of the reticle container 10 are separated from each other during the vertical transportation in current embodiment. A plurality of fastening portions 407 (two on one side of the edge in this embodiment) are further disposed on the edge of the reticle container 10, thus to tightly lock the upper cover 100 and the lower cover 200. Therefore, the airtight, structural stability of the entire reticle container 10 has been further enhanced.

Figure 6:
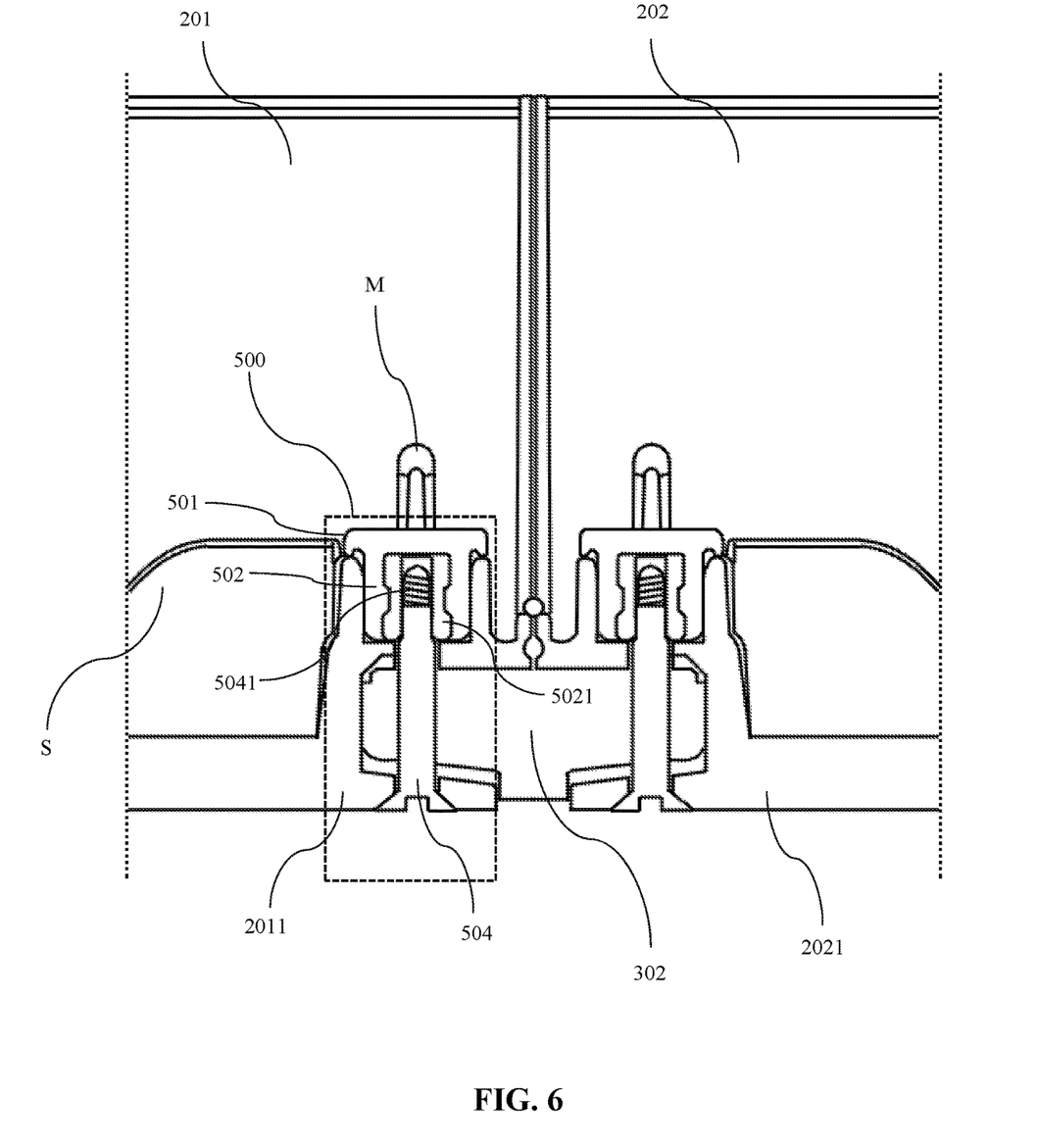
FIG. 6 is a structure diagram of the connecting module according to the embodiment of the present invention.

Please refer to FIG. 5 and FIG. 6, FIG. 6 is a structure diagram of the connecting module according to the embodiment of the present invention. As shown in FIG. 2 and FIG. 6, the first left connecting zone 1011, first right connecting zone 1021, second left connecting zone (Not shown in FIG.

2 but a part of the lower cover 200), second right connecting zone (Not shown in FIG. 2 but a part of the lower cover 200) individually comprise a plurality of connecting module 500.

Moreover, each connecting module 500 comprises a bolt 501 and a pin 504. The pin 504 respectively passes through the reticle container 10 and the main frame 302 of the assembling unit 300 then connected with the bolt 501 from outside of the reticle container 10. Please see FIG. 5, the first left connecting zone 1011, first right connecting zone 1021, second left connecting zone (Not shown in FIG. 2 but a part of the lower cover 200) and second right connecting zone (Not shown in FIG. 2 but a part of the lower cover 200) are composed by two kinds of ribs. One is the main rib M which penetrates and configured on the boundary of the first left connecting zone 1011, first right connecting zone 1021, second left connecting zone (Not shown in FIG. 2 but a part of the lower cover 200) and second right connecting zone (Not shown in FIG. 2 but a part of the lower cover 200). On the other hand, side ribs W are configured on two sides of each main rib M. In the present embodiment, the side ribs W are helpful for maintaining the stability of the main rib M. Moreover, the joint points between the side ribs W and the main rib M are the locations for configuring connecting module 500.

Figure 7:
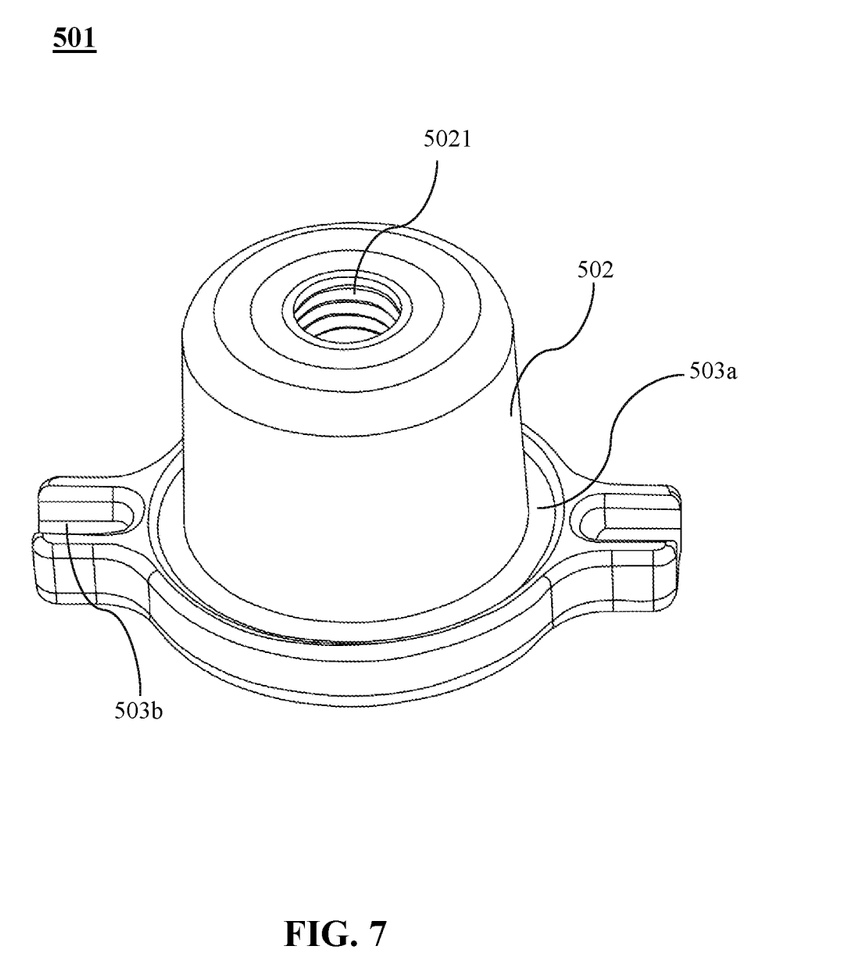
FIG. 7 is a structure diagram of the bolt according to the embodiment of the present invention.

Please refer to FIG. 7, FIG. 7 is a structure diagram of the bolt according to the embodiment of the present invention. As shown in FIG. 5 to FIG. 7, the structure of the bolt 501 is designed to be suitable for aforementioned main rib M and side ribs W. In other words, the structure of bolt 501 further has a function to locate the correct installation position via this structure per se. Hence the bolt 501 described in the present embodiment comprises a pillar 502, sealing trench 503a and at least one positioning wing 503b. A screw hole 5021 is configured in the pillar 502, and the sealing trench 503a is deposed on bottom of said pillar 502. The at least one positioning wings 503b are configured on boundary of the sealing trench 503a.

Therefore, when the bolt 501 has been installed, the sealing trench 503a will form a first sealing line which is suitable for the shape of main rib M. On the other hand, the number of the positioning wings 503b in this embodiment is two. The aforementioned positioning wings 503b are arranged on a straight line. When the bolt 501 is installed, the positioning wings 503b which are on the same straight line can engage with the main rib M. That is, the above-mentioned structure is not only helpful for decreasing the difficulty of installation, but prevents the displacement of sealing trench 503a and positioning wings 503b, further minimizes the risk of air leakage of the reticle container 10.

In this embodiment, after the installation of the bolt 501, the pin 504 will passes through the reticle container 10 and engages with the bolt 501. As shown in FIG. 6, the top of the pin 504 further comprises a top screw 5041 which has a miner radius. In order to the structure of top screw 5041, the top screw 5041 is able to engages with the screw hole 5021 configured on the pillar 502, thus to perform a great stability between the pin 504 and pillar 502. Furthermore, the pin 504 in the present embodiment has a funnel-shaped structure which is configured on the outside of the reticle container 10. This funnel-shaped structure will significantly increase the sealing level of the reticle container 10.

Figure 8:
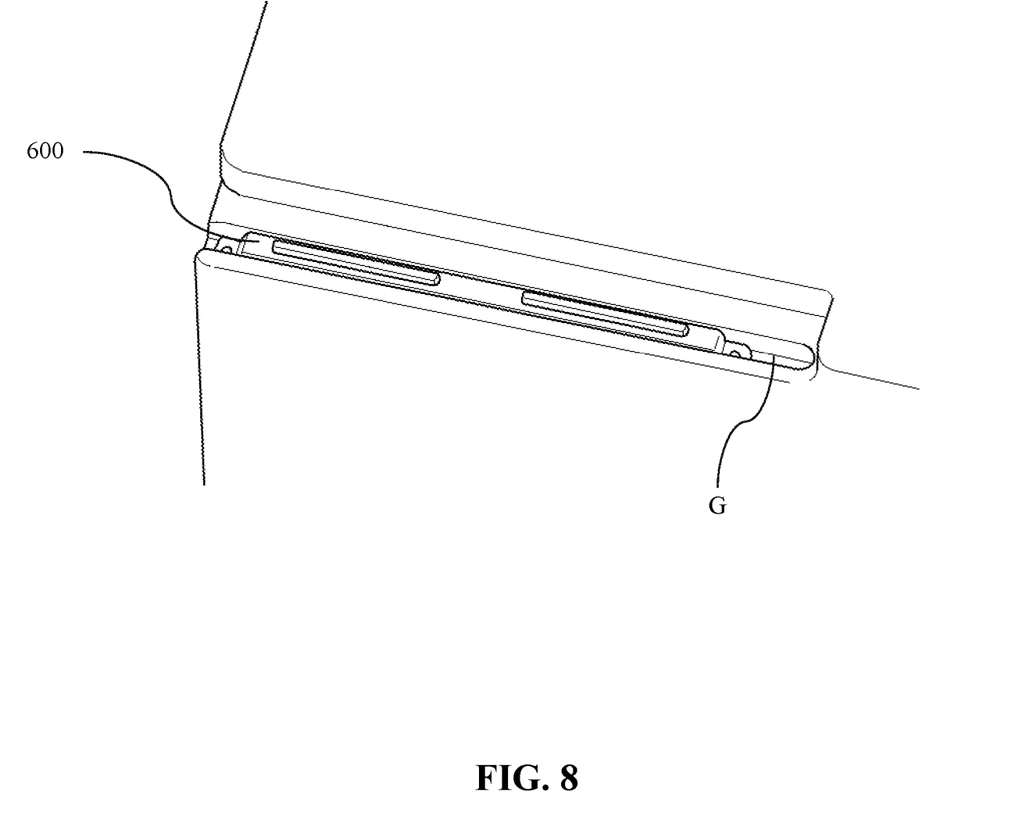
FIG. 8 is an installation diagram of the sustainer according to the embodiment of the present invention.
Figure 9:
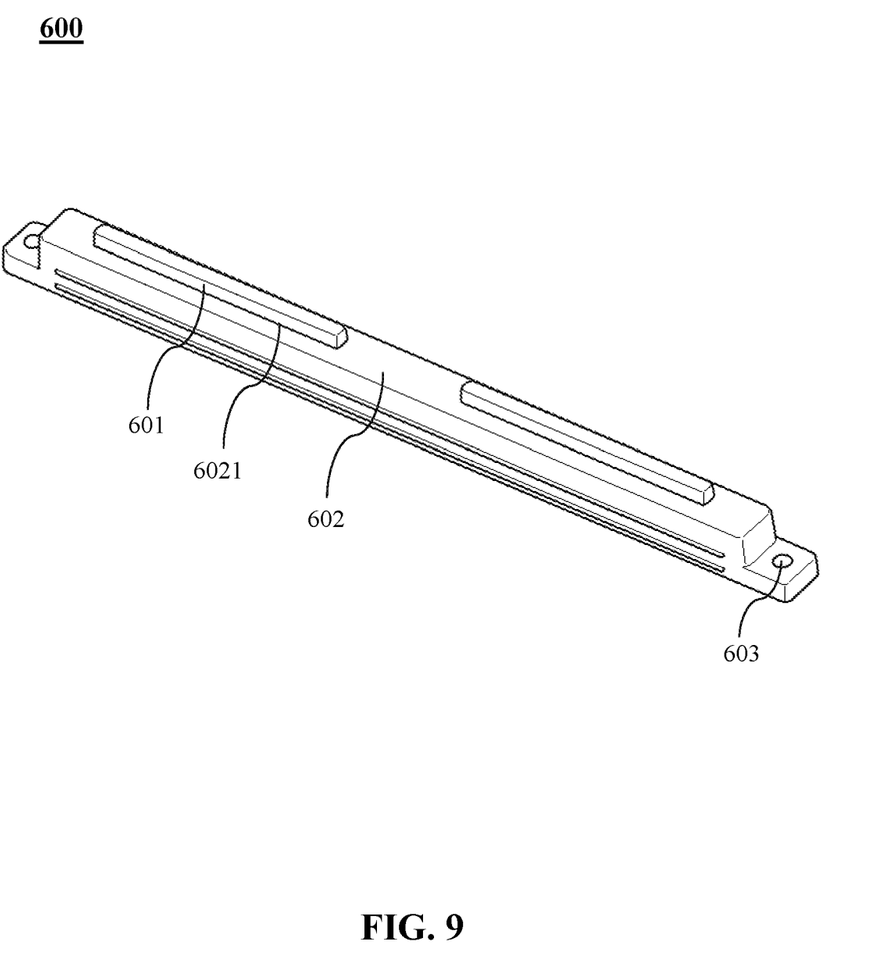
FIG. 9 is a structure diagram of the sustainer according to the embodiment of the present invention.

Please refer to FIG. 5, FIG. 8 and FIG. 9. FIG. 8 is an installation diagram of the sustainer according to the embodiment of the present invention. FIG. 9 is a structure diagram of the sustainer according to the embodiment of the present invention. First of all, as shown in FIG. 5, the four corners of the inner space of the lower cover 200 in reticle contain 10 are defined as the sustaining area S. As shown in FIG. 8, a groove G is configured in such sustaining area S and at least one sustainer 600 is correspondingly configured in said groove G. In other words, in this embodiment, there are multiple sustainers 600 configured in every sustaining area S simultaneously. The reason why this embodiment using multiple sustainers 600 is to keep the large-sized reticle stable and supply the sufficient supporting force without displacement.

In the present embodiment, each sustainer 600 comprises a sustaining body (Not shown in the FIG. 8 or FIG. 9 but embedded in elastic body 602), at least one strip-shaped sustaining unit 601, elastic body 602, and at least one installing hole 603. The at least one strip-shaped sustaining unit 601 is configured on the sustaining body (Not shown in the FIG. 8 or FIG. 9 but embedded in elastic body 602), and the elastic body 602 has at least one gap 6021 which the number of it is the same as the strip-shaped sustaining unit 601. In this embodiment, the at least one strip-shaped sustaining unit 601 extends out of a distance from each of the gap 6021, and the at least one installing hole 603 configured on the sustaining body (Not shown in the FIG. 8 or FIG. 9 but embedded in elastic body 602) and the elastic body 602 simultaneously. Moreover, the installing hole 603 can be configured on the left and right ends or the bottom of the sustainer 600, and maintain the sustainer 600 staying in the groove G. This invention is not limited thereto.

Figure 10:
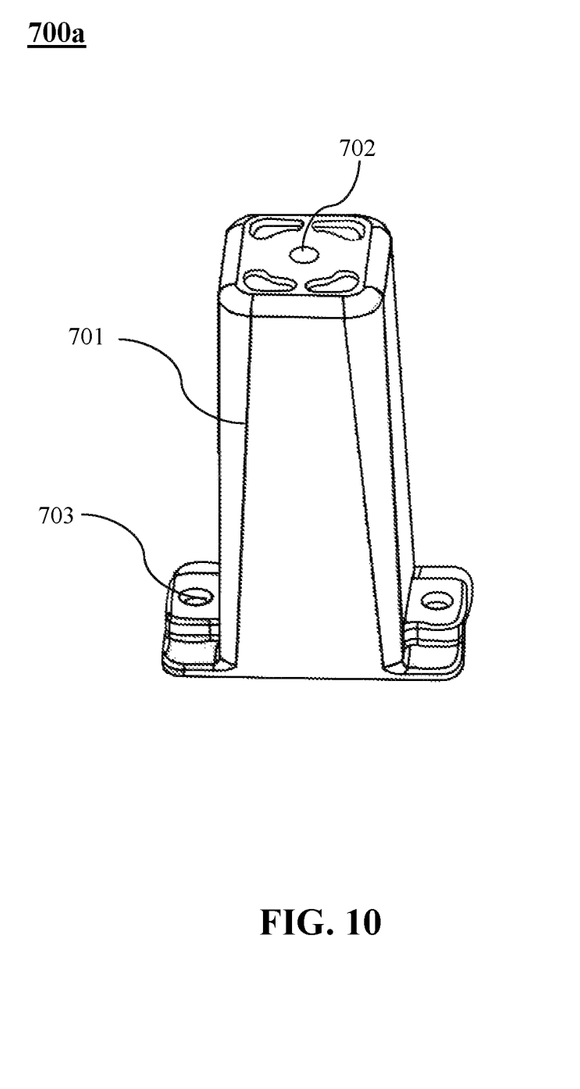
FIG. 10 is a structure diagram of the supporter according to the embodiment of the present invention.
Figure 11:
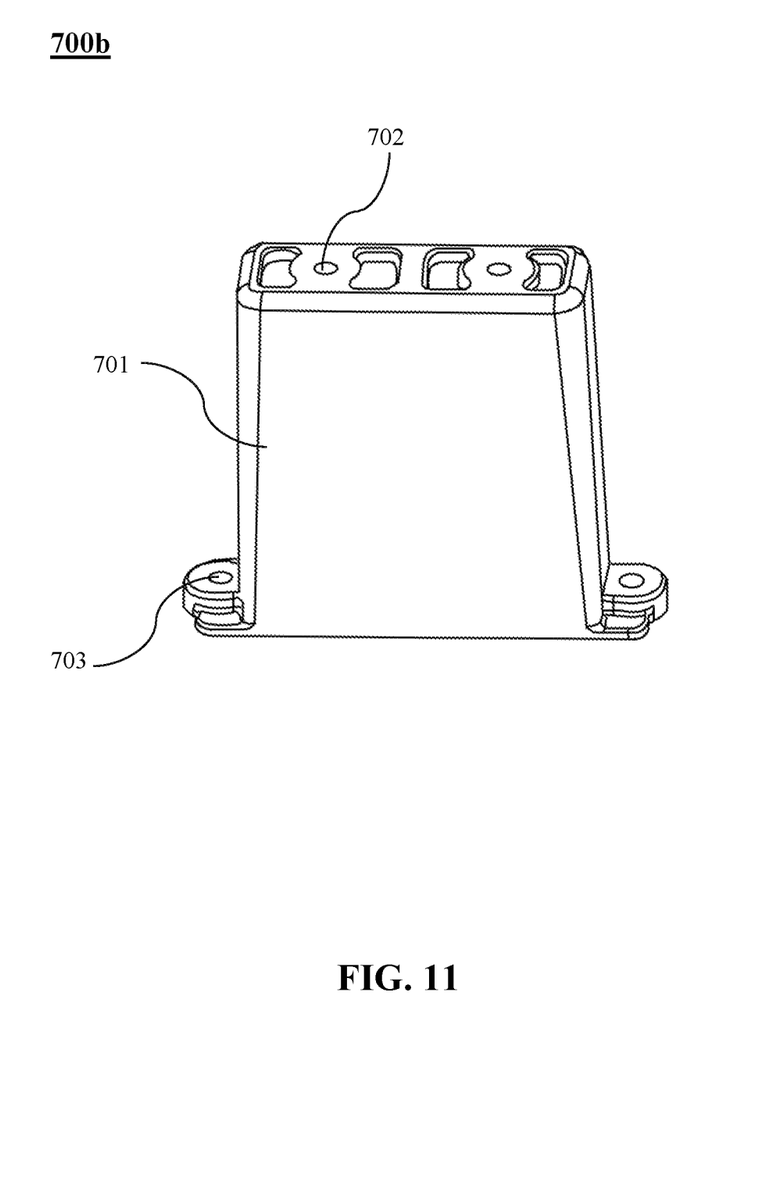
FIG. 11 is the other structure diagram of the supporter according to the embodiment of the present invention.
Figure 12:
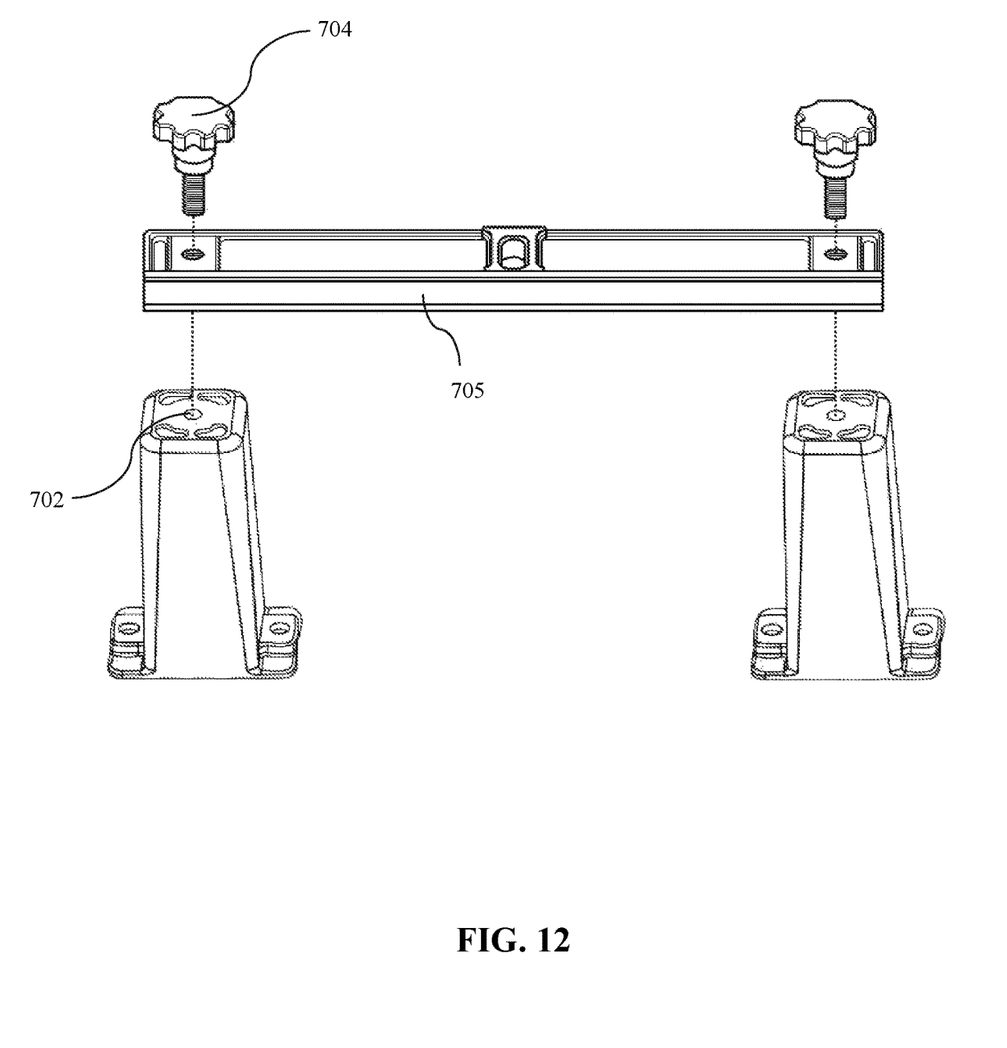
FIG. 12 is a structure diagram of the supporting pin and the connector according to the embodiment of the present invention.

Please refer to FIG. 4 to FIG. 5 and FIG. 10 to FIG. 12. FIG. 10 is a structure diagram of the supporter according to the embodiment of the present invention. FIG. 11 is the other structure diagram of the supporter according to the embodiment of the present invention. FIG. 12 is a structure diagram of the supporting pin and the connector according to the embodiment of the present invention.

The FIG. 4 shows the installation of supporter 700b. Furthermore, please refer to FIG. 5, it shows that the supporter 700b is configured in the supporting area R. In the instant embodiment, the reticle container 10 contains the large-sized reticle and has different ways to transferring or storage. The configuration requirements and needs of the reticle container 10 are different.

Therefore, a plurality of supporting point RP is configured on the every supporting area R, and a constant distance is set between each of the supporting point RP. The aforementioned supporting points RP are connected with the supporter 700a or supporter 700b. In other words, this structure provides the diversity of adjusting the location of distinguishable supporters 700a or supporters 700b, for the large-sized reticle having different height requirements or weights.

As shown in FIG. 10 to FIG. 12. The current embodiment comprises two kinds of supporters which are supporter 700a and supporter 700b. The shape of the supporter 700a is like a square column, and the supporter 700b is like a cuboid. The supporter 700a, 700b of the embodiment comprises a supporting body 701 and an adjustable portion 703. The supporting body 701 comprises a top portion 702 which is designed to accept pins or screws, the present invention is not limited thereto. The adjustable portion 703 is configured on bottom of the supporting body 701. Therefore, adjustable portion 703 is detachably connected with the aforementioned supporting points RP. Furthermore, as shown in FIG. 12, at least one supporting pin 704 and at least one connector 705 link the top portions 702 of supporters 700a.

In other words, the supporting pin 704 is designed to have a screw portion, and the top per se is designed as a gear-shaped nut, thus the user is able to rotate and adjust said supporting pin 704. On the other hand, the aforementioned gear-shaped nut further forms a dome structure. Therefore the supporting pin 704 can minimize the contact area of the large-sized reticle via a single point, preventing the chance to be scratched.

Overall, the present embodiment is able to adjust the height of supporting pins 704, satisfying different needs and requirements of large-sized reticles having various sizes. The connector 705 can be passed through by the supporting pins 704 and engage with the top portions 702. The connector 705 not only distribute the weight to the plurality of supporters 700a, 700b, but also limit the height of each supporting pin 704 to the same place when the supporting pin 704 is tightened. In addition, if the connector 705 links over across the first left case 101 and the first right case 102, it further stabilizes the structure of the reticle container 10.

There are many inventions described and illustrated above. The present inventions are neither limited to any single aspect nor embodiment thereof, nor to any combinations and/or permutations of such aspects and/or embodiments. For the sake of brevity, many of those permutations and combinations will not be discussed separately herein.

What is claimed is:

1. A reticle container, comprising:
   a plurality of assembling unit;
   an upper cover, comprising:
      a first left case, connecting to one of the plurality of assembling unit by a first left connecting zone;
      a first right case, connecting to one of the plurality of assembling unit which is the same as the first left case by a first right connecting zone;
   a lower cover, comprising:
      a second left case, connecting to another one of the plurality of assembling unit by a second left connecting zone; and
      a second right case, connecting to one of the plurality of assembling unit which is the same as the second left case by a second right connecting zone;
   wherein the upper cover matches with the lower cover, forming an edge;
   wherein at least one identification module is configured on the edge;
   wherein four corners of an inner space of the upper cover or the lower cover constructed as a sustaining area and boundary of the inner space of the lower cover is constructed as a supporting area;
   wherein the first left connecting zone, the first right connecting zone, the second left connecting zone, and the second right connecting zone individually comprise a plurality of connecting module.

2. The reticle container as claimed in claim 1, wherein the identification module comprising:
   a slot having an opening;
   an identification unit configured on the edge which is near by the slot;
   a monitoring device deposed in the slot via the opening; and
   a cover matches to the opening.

3. The reticle container as claimed in claim 2, wherein at least one engaging unit is configured on the monitoring device, and the at least one engaging unit detachably connects to at least one engaging slot which is configured in the slot.

4. The reticle container as claimed in claim 1, wherein the connecting module comprises:
   a bolt;
   a pin passes through the reticle container and connected with the bolt from outside of the reticle container.

5. The reticle container as claimed in claim 4, wherein the bolt comprising:
   a pillar having a screw hole;
   a sealing trench deposed on bottom of the pillar; and
   at least one positioning wing configured on boundary of the sealing trench.

6. The reticle container as claimed in claim 5, wherein the pin further comprises a top screw which engages with the screw hole.

7. The reticle container as claimed in claim 1, wherein at least one sustainer is configured on the sustaining area, the sustainer comprising:
   a sustaining body;
   at least one strip-shaped sustaining unit configured on the sustaining body;
   an elastic body having at least one gap, wherein the elastic body covers the sustaining body and the at least one strip-shaped sustaining unit extends a distance from each of the gap; and
   at least one installing hole configured on the sustaining body and the elastic body simultaneously.

8. The reticle container as claimed in claim 1, wherein a plurality of supporting point is configured on the supporting area, wherein a constant distance is set between each of the supporting point;
   wherein the plurality of supporting point is connected with a plurality of supporter.

9. The reticle container as claimed in claim 8, wherein the supporter comprising:
   a supporting body having a top portion; and
   an adjustable portion configured on bottom of the supporting body, the adjustable portion detachably connects the plurality of supporting point.

10. The reticle container as claimed in claim 9, wherein at least one supporting pin and at least one connector further link the top portion of the plurality of supporter.

* * * * *